(12) United States Patent
Priel et al.

(10) Patent No.: US 7,977,983 B1
(45) Date of Patent: Jul. 12, 2011

(54) DEVICE HAVING SYNCHRONIZING CAPABILITIES

(75) Inventors: Michael Priel, Hertzlya (IL); Shlomo Beer Gingold, Givat Shmuel (IL); Dan Kuzmin, Givat Shmuel (IL)

(73) Assignee: Freescale Semiconductor, Inc., Austin, TX (US)

( * ) Notice: Subject to any disclaimer, the term of this patent is extended or adjusted under 35 U.S.C. 154(b) by 45 days.

(21) Appl. No.: 12/113,216

(22) Filed: May 1, 2008

(51) Int. Cl.
*H03L 7/00* (2006.01)
(52) U.S. Cl. ......................................... 327/145; 327/199
(58) Field of Classification Search .......... 327/141–163, 327/199, 202–204
See application file for complete search history.

(56) References Cited

U.S. PATENT DOCUMENTS

| | | | |
|---|---|---|---|
| 4,820,939 A | 4/1989 | Sowell et al. | |
| 5,081,377 A | 1/1992 | Freyman | |
| 5,376,848 A * | 12/1994 | Hanke et al. | 327/141 |
| 7,042,895 B1 * | 5/2006 | Nguyen et al. | 370/442 |
| 2006/0017482 A1 * | 1/2006 | Chauhan et al. | 327/205 |
| 2008/0007310 A1 * | 1/2008 | Austin et al. | 327/152 |
| 2008/0226004 A1 * | 9/2008 | Oh | 375/358 |

\* cited by examiner

*Primary Examiner* — Lincoln Donovan
*Assistant Examiner* — Diana J Cheng

(57) ABSTRACT

A method and a device having synchronizing capabilities, the device includes; (i) a first circuit that is adapted to receive a first clock signal; (ii) a second circuit that is adapted to receive a second clock signal; wherein the first and second clock signals and mutually asynchronous; and a (iii) synchronizer that is coupled between the first and second circuit and is adapted to receive the second clock signal, to receive an input signal from the first circuit and to output an output signal of definite values to the second circuit, wherein the input signal is synchronized with the first clock signal and the output signal is synchronized with the second clock signal.

20 Claims, 4 Drawing Sheets

DEVICE HAVING SYNCHRONIZING CAPABILITIES

FIELD OF THE INVENTION

This invention relates to a device having synchronizing capabilities and a method for synchronizing.

BACKGROUND OF THE INVENTION

Modern integrated circuits utilize multiple clock signals that can be mutually asynchronous. Using mutually asynchronous clock signals can cause data corruption, especially when signals are sampled during an assertion period or during a negation period and especially before the level of a sampled signal is definite. It is known that sampling a signal that has an indefinite level can result in an unpredictable outcome. When a flip-flop samples an uncertain signal, it can enter a meta-stable state.

Prior art synchronizers include a sequence of at least two flip-flops, wherein the last flip-flop samples the output signal of the previous flip-flop. These flip-flips receive the same clock signal and there is a very low chance that all of these flip-flops will enter a meta-stable state. It is noted that this arrangement is robust but is area consuming and introduces a relatively long delay.

SUMMARY OF THE INVENTION

The present invention provides a device and a method as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects, and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

In the following specification, the invention will be described with reference to specific examples of embodiments of the invention. It will, however, be evident that various modifications and changes may be made therein without departing from the broader spirit and scope of the invention as set forth in the appended claims.

It has been found that a system meta-stable state can be prevented by utilizing a feedback circuit that forces a master latch to maintain its previous state unless a definite input signal is sampled by the master latch. The feedback circuit may for example, write to the master latch its previous value so that if an indefinite input signal is provided to (is sampled by) the master latch then the master latch does not change its state.

The feedback circuit may be adapted to write to the master latch a previous output value of a slave latch that is connected to the master latch (which equals the previous value of the master latch) if the previous output value of the slave latch equals a current output value of the master latch.

The master latch can be followed by a master inverter that has a high to low switching point that is lower than its low to high switching point, thus making it more robust to changes of the input signal and especially to changes that do not amount in a definite level.

Figure 1:
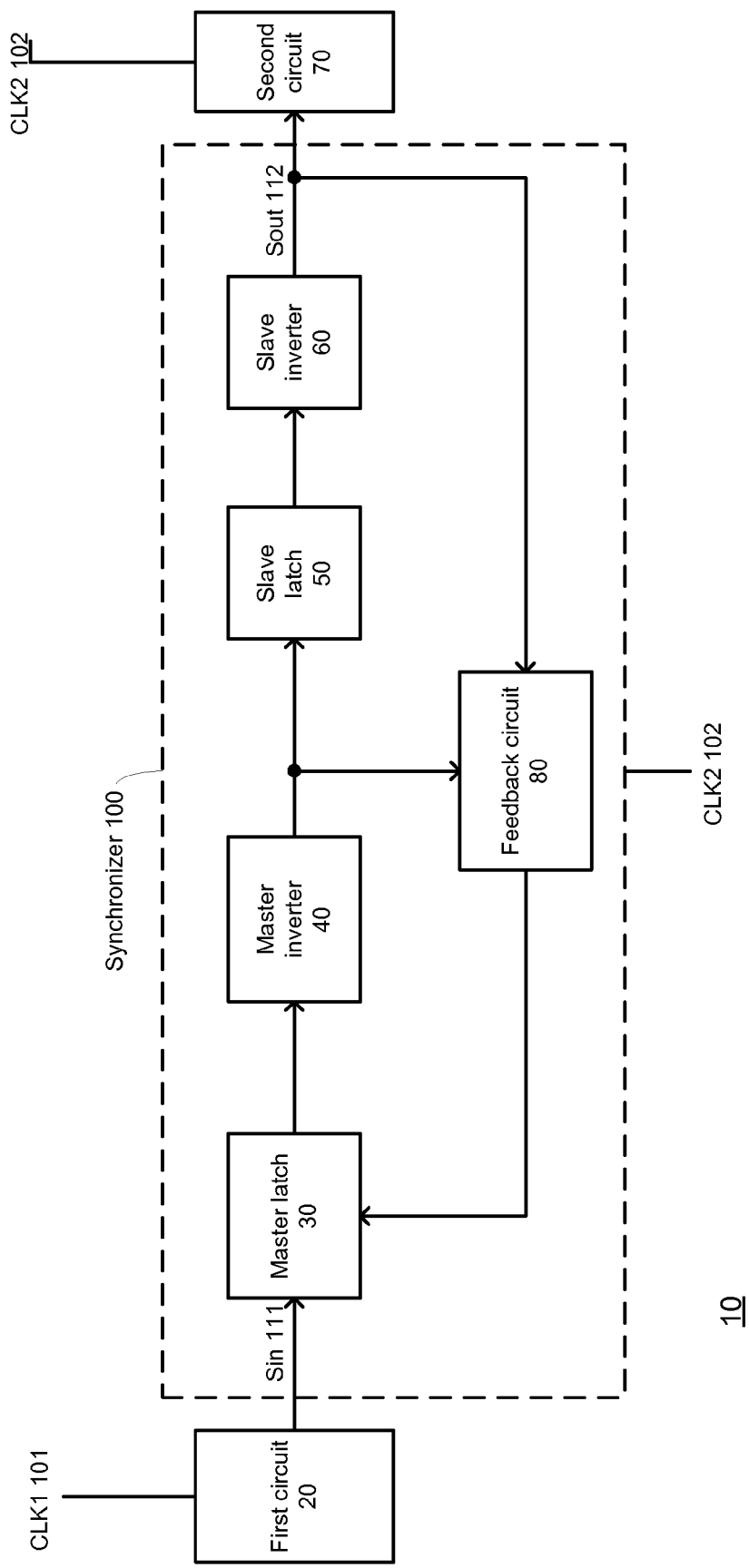
FIG. 1 schematically shows an example of an embodiment of a device having synchronizing capabilities.

FIG. 1 schematically shows an example of an embodiment of device 10 having synchronizing capabilities.

Device 10 includes: (i) first circuit 20 that is fed by first clock signal CLK1 101; (ii) second circuit 70 that is fed by second clock signal CLK2 102, wherein CLK1 101 and CLK2 102 are mutually asynchronous; and (iii) synchronizer 100 that is connected between the first and second circuits 20 and 70 and is fed by CLK2 102.

Synchronizer 100 receives an input signal (Sin 111) that is synchronized to first clock signal CLK 1 101 from first circuit 20 and provides to second circuit 70 an output signal (Sout 120) of definite values, the output signal can equal Sin 111 but is synchronized to second clock signal CLK2 102.

Synchronizer 100 includes: (i) master latch 30 that receives an input signal (Sin 111) from first circuit 20; (ii) master inverter 40; (iii) slave latch 50; (iv) slave inverter 60, wherein slave inverter 60 outputs to second circuit 70 an output signal (Sout 112) of a definite level; and (iv) feedback circuit 80. The input of master latch 30 is connected to an output of first circuit 20 and to an output of feedback circuit 80. The output of master latch 30 is connected to an input of master inverter 40. The output of master inverter 40 is connected to an input of slave latch 50 and to an input of feedback circuit 80. The output of slave latch 50 is connected to an input of slave inverter 60. The output of slave inverter 60 is connected to an input of feedback latch 80 and to an input of second circuit 70. The connections may be a type of connection suitable to transfer signals from or to the respective nodes, units, or devices, for example via intermediate devices. Accordingly, unless implied or stated otherwise the connections may for example be direct connections or indirect connections.

Feedback circuit 80 is adapted to write to master latch 30 a previous output value of slave latch 40 if the previous output value of slave latch 50 equals a current output value of master latch 30. Feedback circuit 80 can be prevented from affecting a state of master latch 30 if the previous output value of slave latch 50 differs from a current output value of master latch 30.

The writing can involve sending a pulse and especially a short duration pulse (about 5%-20% of the cycle of second clock signal) a to the master latch of the synchronizer. This pulse can accelerate an exit from a meta stable state. The pulse can be of a medium duration (about 20%-35% of the cycle of second clock signal) and even long duration (35%-50% of the cycle of second clock signal). The duration of the pulse can be determined by control signals that open and close transfer gates of the feedback circuit.

Figure 2:
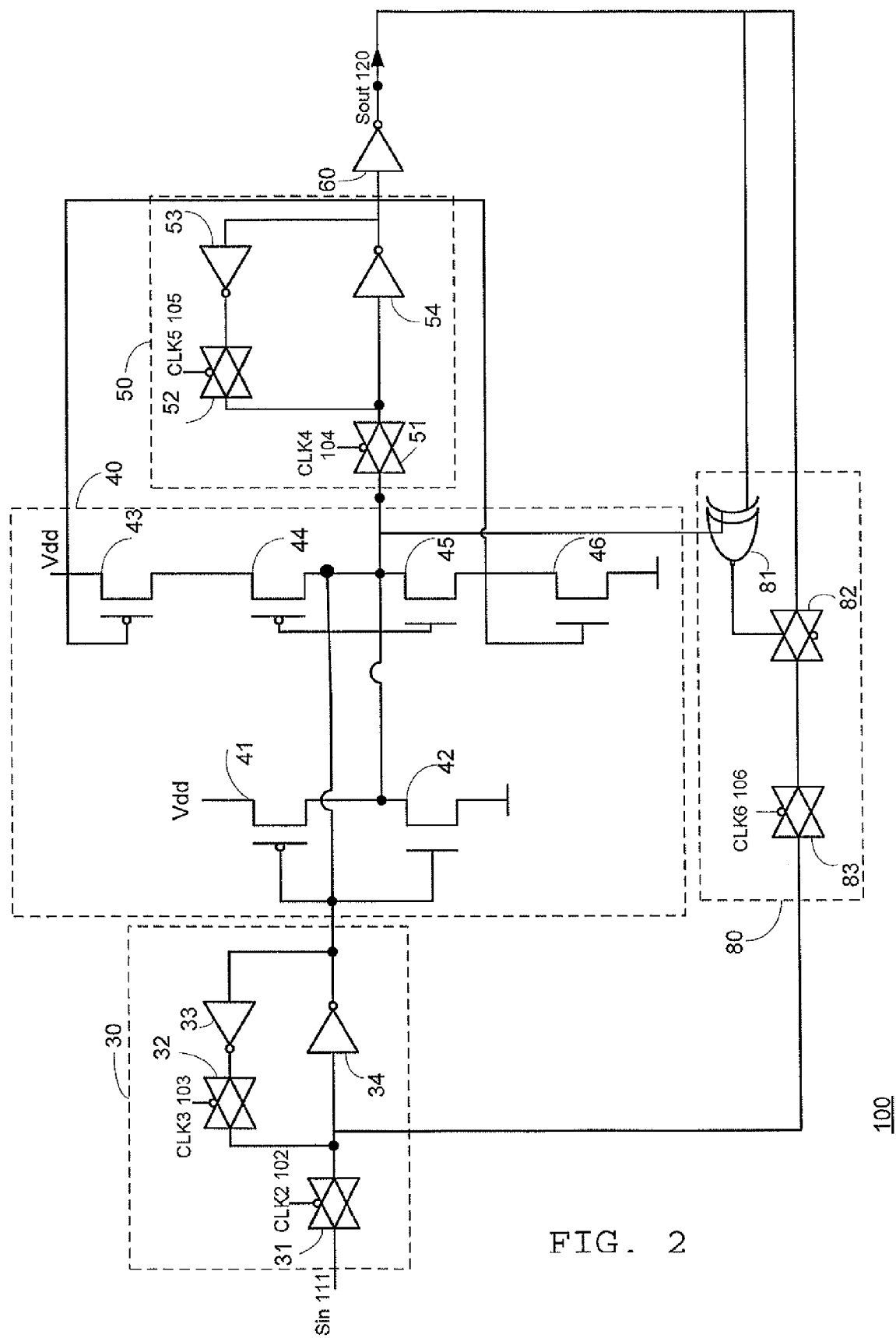
FIG. 2 schematically shows an example of an embodiment of a synchronizer.

FIG. 2 schematically shows an example of an embodiment of synchronizer 100.

In the example of FIG. 2, master latch 30 includes first transfer gate 31, inverters 33 and 34 and master transfer gate 32. The input of first transfer gate 31 receives input signal Sin 111. In operation, the output of first transfer gate 31 is connected to an input of inverter 34, to an output of master transfer gate 32 and to an output of feedback circuit 80. The output of inverter 34 is connected to an input of inverter 33 and to an input of master inverter 40. The output of inverter 33 is connected to an input of master transfer gate 32. First transfer gate 31 receives second clock signal CLK2 102 while master transfer gate 32 can receive the second clock signal or a slightly delayed clock signal (CLK3 103). The latter scenario is illustrated in FIG. 2.

Slave latch 50 includes second transfer gate 51, inverters 53 and 54 and slave transfer gate 52. The input of second transfer gate 51 receives the output signal of master inverter 40. The output of second transfer gate 51 is connected to an input of inverter 54, to an output of slave transfer gate 52 and to a first input of XOR gate 81 of feedback circuit 80. The output of inverter 54 is connected to an input of inverter 53 and to an input of slave inverter 60. The output of inverter 53 is connected to an input of slave transfer gate 52. Second transfer gate 51 receives fourth clock signal CLK4 104 while slave transfer gate 52 can receive the fourth clock signal or a slightly delayed clock signal (CLK5 105). The latter scenario is illustrated in FIG. 2. CLK4 104 can be an inverted version of CLK1 102 or a slightly delayed and inverted version of CLK 1 101.

Feedback circuit 80 includes XOR gate 81, feedback transfer gate 82 and another transfer gate 83. The output of slave inverter 60 is connected to another input of XOR gate 81 and a feedback transfer gate 82. XOR gate 81 performs a XOR operation on a master inverter output signal (outputted from master inverter 40) and output signal Sout 120. Alternatively, XOR gate 81 can be connected to the outputs of master latch 30 and slave latch 50.

XOR gate 81 outputs a control signal that can open feedback transfer gate 82. When feedback transfer gate 82 is open, it passes Sout 112 towards master latch 30. Feedback transfer gate 82 can be followed by another transfer gate 83 that receives a delayed version (for example CLK6 106) of CLK2 102 in order to synchronize the writing of Sout 112 to master latch 30 to a period during which master latch 30 is open.

Figure 3:
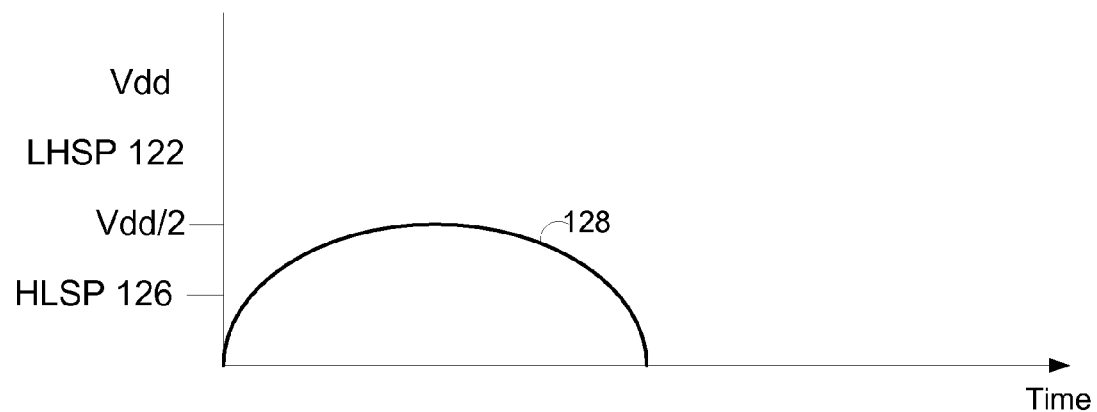
FIG. 3 schematically shows an example of signals of an embodiment of a device having synchronizing capabilities.
Figure 3:
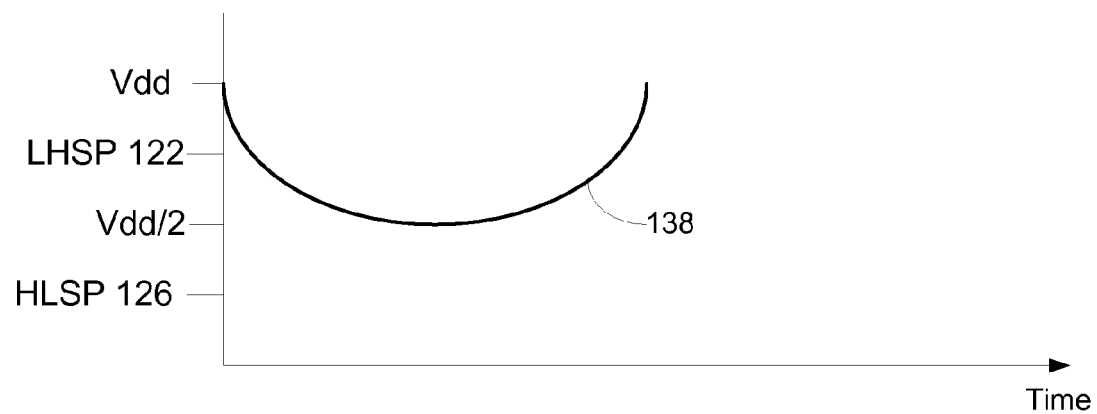

Master inverter 40 can have a high to low switching point (HLSP 122 of FIG. 3) and a low to high switching point (LHSP 126 of FIG. 3). These switching points differ from each other, in order to make master inverter 40 more robust to slight changes of Sin 111. These switching points prevent a change in the value of Sout 112 unless a certain change of Sin 111 is detected.

The high to low switching point can be substantially lower than the low to high switching point. For example, the high to low switching point can be 10-50% lower than the low to high switching point.

The high to low switching point can be lower than half a supply voltage level and the low to high switching point can be higher than half of the supply voltage level.

Master inverter 40 includes first PMOS transistor 41, second PMOS transistor 44, third PMOS transistor 43, first NMOS transistor 42, second NMOS transistor 45, and third NMOS transistor 46. First PMOS transistor 41 and first NMOS transistor 42 are serially coupled to each other. The gates of first PMOS transistor 41, second PMOS transistor 44, first NMOS transistor 42 and second NMOS transistor 45 are coupled to an output node 36 of master latch 30. Drains of first PMOS transistor 41, first NMOS transistor 42, second PMOS transistor 44 and second NMOS transistor 45 are coupled to slave latch 50. The gates of third PMOS transistor 43 and third NMOS transistor 46 are coupled to an output of slave latch 50.

First PMOS transistor 41 and first NMOS transistor 42 form a first inverter stage that is connected in parallel to a second inverter stage that includes second PMOS transistor 44, third PMOS transistor 43, second NMOS transistor 45, and third NMOS transistor 46. These two inverter stages invert a signal that is outputted from master latch 30. The second inverter stage also receives an output signal of slave latch 50 and this output signal determines which transistors of the second inverting stage are active.

Assuming that the previous value of the output signal of master latch 30 is low and the previous value of slave latch 50 is high. Accordingly, when Sin 111 only starts to increase, PMOS transistors 41, 43 and 44 are highly conductive while NMOS transistors 42, 45 and 46 are non-conductive or only slightly conductive. Accordingly, the PMOS branch of master inverter 40 is more dominant, leading to a relatively high-level low to high switching point.

Assuming that the previous value of the output signal of master latch 30 is high and the previous value of slave latch 50 is low. Accordingly, when Sin 111 only starts to decrease, NMOS transistors 42, 45 and 46 are then highly conductive while NMOS transistors 41, 43 AND 44 are non-conductive or only slightly conductive. Accordingly, the NMOS branch of master inverter 40 is more dominant, leading to a relatively low-level high to low switching point.

Referring now to FIG. 3, signals of an example of an embodiment of a device having synchronizing capabilities, are shown therein.

Graph 128 illustrates a certain increment of Sin 111 from zero volts to substantially half of the supply voltage (Vdd/2). The low to high switching point LHSP 122 of master inverter 40 is above Vdd/2 thus does not change its state. In addition, feedback circuit 80 forces the input signal of master latch 20 to lower to zero, as illustrated by curve 128. This assists in preventing a meta-stable state of the master inverter.

Graph 138 illustrates a certain decrement of Sin 111 from about Vdd to substantially half of the supply voltage (Vdd/2). The high to low switching point HLSP 126 of master inverter 40 is below Vdd/2 thus does not change its state. In addition, feedback circuit 80 forces the input signal of master latch 20 to Vdd, as illustrated by curve 138 and prevents glitches of the master inverter.

Figure 4:
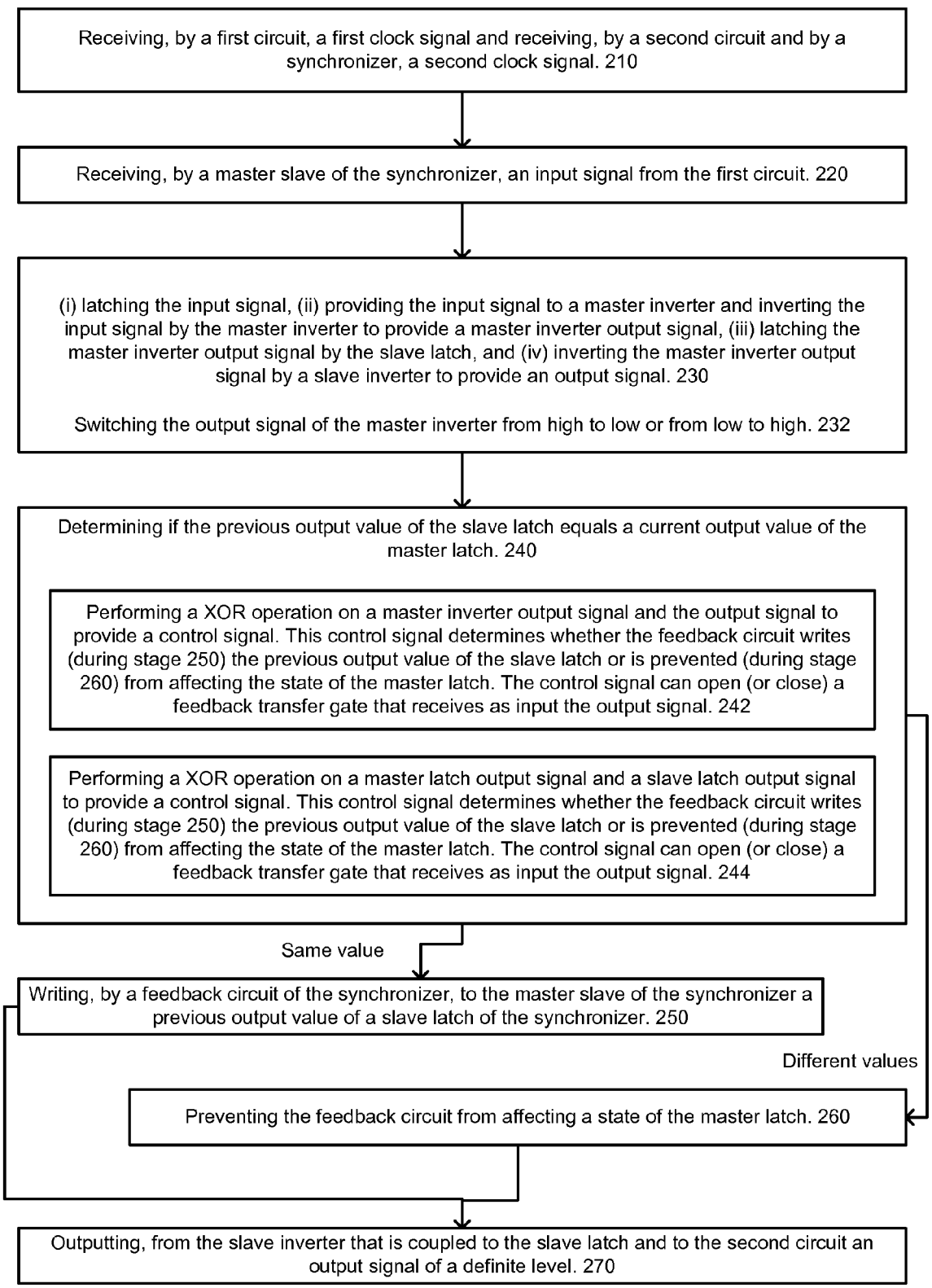
FIG. 4 schematically shows an example of an embodiment of a method for preventing a meta-stable state of a synchronizer.

FIG. 4 schematically shows an example of an embodiment of method 200 for preventing a meta-stable state of a synchronizer.

Method 200 includes stages that can be executed in a pipelined manner. Referring to the example set forth in FIG. 1, signals propagate through a flip-flop and especially propagate through master latch, inverted by master inverter, propagate through slave latch and inverted by slave inverter. Some of these signals are provided to a feedback circuit that can write back to the master latch a previous output signal of the slave latch or the slave inverter.

Method 200 starts by stage 210 of receiving, by a first circuit, a first clock signal and receiving, by a second circuit and by a synchronizer, a second clock signal. The first circuit uses the first clock as a time base and the second circuit uses the second clock as a time base.

Stage 210 is followed by stage 220 of receiving, by a master latch of the synchronizer, an input signal from the first circuit.

Stage 220 is followed by stages 230 and 240.

Stage 230 includes: (i) latching the input signal, (ii) providing the input signal to a master inverter and inverting the input signal by the master inverter to provide a master inverter output signal, (iii) latching the master inverter output signal by the slave latch, and (iv) inverting the master inverter output signal by a slave inverter to provide an output signal. The output signal may be provided to the second circuit. While the input signal is synchronized with the first clock the output signal is synchronized with the input clock.

Stage 240 includes determining if the previous output value of the slave latch equals a current output value of the master latch.

If the answer is positive, (these signals are of the same value) then stage 240 is followed by stage 250 of writing, by a feedback circuit of the synchronizer, to the master latch of the synchronizer a previous output value of a slave latch of the synchronizer, in order to prevent a meta-stable state.

Stage 250 can include sending a pulse and especially a short duration pulse to the master latch of the synchronizer. This pulse can accelerate an exit from a meta-stable state. The pulse can be of a medium duration and even long duration. The duration of the pulse can be a fraction of the cycle of second clock signal. The duration of the pulse can be determined by control signals that open and close transfer gates of the feedback circuit.

If the answer is negative, (the values of these signals differ from each other) then stage 240 is followed by stage 260 of preventing the feedback circuit from affecting a state of the master latch.

The conditional writing of feedback signal to the master latch causes the latching stage of the master latch to include: (i) latching, by a master latch of the synchronizer, an input signal from the first circuit, if a previous output value of a slave latch that is coupled to the master latch equals a current output value of the master latch; wherein the slave latch is coupled to the master latch; and (ii) latching, by the master latch a feedback signal from a feedback circuit if the previous output value of the slave latch equals the current output value of the master latch, a feedback signal from the feedback circuit.

Stages 250 and 260 are followed by stage 270 of outputting, from the slave inverter that is coupled to the slave latch and to the second circuit an output signal of a definite level. Multiple iterations of stages 230, 240, 250, 260 and 270 can be executed during one or two synchronizer cycles. These multiple iterations can help in a conversion to a definite state.

Stage 240 can include stage 242 of performing a XOR operation, for example, on a master inverter output signal and the output signal to provide a control signal. This control signal determines whether the feedback circuit writes (during stage 250) the previous output value of the slave latch or is prevented (during stage 260) from affecting the state of the master latch. The control signal can open (or close) a feedback transfer gate that receives as input the output signal.

Accordingly, method 200 can include receiving an output signal by a feedback transfer gate; performing a XOR operation on a master inverter output signal and the output signal to provide a control signal; and opening the feedback transfer gate, in response to the control signal, to facilitate a writing of the output signal to the master latch.

Stage 240 can include stage 244 of performing a XOR operation, for example, on a master latch output signal and a slave latch output signal to provide a control signal. This control signal determines whether the feedback circuit writes (during stage 250) the previous output value of the slave latch or is prevented (during stage 260) from affecting the state of the master latch. The control signal can open (or close) a feedback transfer gate that receives as input the output signal.

Accordingly, method 200 can include receiving an output signal by a feedback transfer gate; performing a XOR operation on a master latch output signal and a slave latch output signal to provide a control signal; and opening the feedback transfer gate, in response to the control signal, to facilitate a writing of the output signal to the master latch.

Stage 230 can includes stage 232 of switching the output signal of the master inverter from high to low or from low to high. Stage 232 can include providing a master latch output signal to a master inverter that has a high to low switching point and a low to high switching point; wherein the high to low switching point is higher than half a supply voltage level and the low to high switching point is lower then half of the supply voltage level. Stage 232 can include providing the a master latch output signal to a master inverter that has a high to low switching point that is substantially higher than a low to high switching point of the master inverter.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. In addition, if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. In addition, plurality of conductors may be replaced with a single conductor that transfers multiple signals serially or in a time-multiplexed manner. Likewise, single conductors carrying multiple signals may be separated out into various different conductors carrying subsets of these signals. Therefore, many options exist for transferring signals.

Although the invention has been described with respect to specific conductivity types or polarity of potentials, skilled artisans appreciated that conductivity types and polarities of potentials may be reversed.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

In addition, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device. For example, However, other modifications, variations, and alternatives are also possible. The specifications and drawings are, accordingly, to be regarded in an illustrative rather than in a restrictive sense.

The word 'comprising' does not exclude the presence of other elements or steps then those listed in a claim. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A device having synchronism capabilities, the device comprises:
    a first circuit that is adapted to receive a first clock signal;
    a second circuit that is adapted to receive a second clock signal; and
    a synchronizer that is coupled between the first and second circuit and is adapted to receive the second clock signal, to receive an input signal from the first circuit and to output an output signal of definite values to the second circuit;
    wherein the synchronizer comprises:
        a master latch, coupled to the first circuit and to a feedback circuit, the master latch comprising an input to receive the input signal, the input coupled to a first node of the master latch wherein the input signal is synchronized with the first clock signal:
        a master inverter, coupled to the master latch and to a feedback circuit, adapted to invert the signal latched by the master latch to provide a master inverter output signal;
        a slave latch, coupled to the master inverter, adapted to latch the master inverter output signal;
        a slave inverter, coupled between the slave latch and the second circuit, wherein the slave inverter inverts a master inverter output signal latched by the slave latch to provide an output signal of a definite level, wherein the output signal is synchronized with the second clock signal: wherein the first and second clock signals are mutually asynchronous: and
        a feedback circuit comprising an output coupled to the first node of the master latch, wherein the feedback circuit receives the master inverter output signal and the output signal to determine when a previous output value of the slave latch equals a current output value of the master latch and write to the master latch the feedback signal, wherein the feedback signal has a value that equals a previous output value of the slave latch when the previous output value of the slave latch equals the current output value of the master latch.

2. The device according to claim 1 wherein the feedback circuit is prevented from affecting a state of the master latch when the feedback circuit when the feedback circuit determines that the previous output value of the slave latch differs from the current output value of the master latch.

3. The device according to claim 1 wherein the feedback circuit comprises a feedback transfer gate, coupled to the slave inverter, to the master latch, and to a XOR logic gate of the feedback circuit; wherein feedback transfer gate passes to the master latch the output signal in response to value of a control signal generated by the XOR logic gate;
    wherein the XOR logic gate performs a XOR operation on the master inverter output signal and the output signal.

4. The device according to claim 1 wherein the feedback circuit comprises a feedback transfer gate, coupled to the slave inverter, to the master latch, and to a XOR logic gate of the feedback circuit; wherein feedback transfer gate passes to the master latch the output signal in response to value of a control signal generated by the XOR logic gate;
    wherein the XOR logic gate performs a XOR operation on a master latch output signal and a slave latch output signal.

5. The device according to claim 1 wherein the master inverter has a high to low switching point that is substantially higher than a low to high switching point of the master inverter.

6. The device according to claim 1 wherein the master inverter has a high to low switching point and a low to high switching point; wherein the high to low switching point is higher than half a supply voltage level and the low to high switching point is lower then half of the supply voltage level.

7. The device according to claim 1 wherein the master inverter comprises: a first PMOS transistor, a second PMOS transistor, a third PMOS transistor, a first NMOS transistor, a second NMOS transistor and a third NMOS transistor; wherein the first PMOS transistor and the first NMOS transistor are serially coupled to each other;
    wherein gates of the first PMOS transistor, the second PMOS transistor, the first NMOS transistor and the second NMOS transistor are coupled to an output node of the master latch; wherein drains of the first PMOS transistor, first NMOS transistor, second PMOS transistor and second NMOS transistor are coupled to the slave latch; wherein gates of the third PMOS transistor and the third NMOS transistor are coupled to an output of the slave latch; wherein the first PMOS transistor, the second PMOS transistor, the third PMOS transistor, the first NMOS transistor, the second NMOS transistor and the third NMOS transistor are adapted to invert a master latch output signal to provide a master inverter output signal.

8. The device according to claim 1 wherein the first latch comprises two master inverters that are preceded by a first transfer gate and also comprises a master transfer gate that is coupled to a master inverter; wherein the master transfer gate is adapted to be opened at a predefined delay in relation to the first transfer gate.

9. The device according to claim 1 the first latch comprises two master inverters that are preceded by a first transfer gate and the second latch comprises two slave inverters that are preceded by a second transfer gate; wherein the second transfer gate is adapted to be opened at a predefined delay in relation to the first transfer gate.

10. The device according to claim 1 wherein the feedback circuit is adapted to write to the master latch the previous output value of the slave latch by sending a short duration pulse.

11. A method for synchronizing two circuits, the method comprises:
receiving, by a first circuit, a first clock signal and receiving, by a second circuit and by a synchronizer, a second clock signal; wherein the synchronizer comprises a master latch having an input coupled to a first node of the master latch, a slave latch, a master inverter, a slave inverter, and a feedback circuit comprising an output coupled to the first node of the master latch, which receives the master inverter output signal and the output signal;
determining when a previous output value of the slave latch equals a current output value of the master latch;
writing, by the feedback circuit, to the master slave a feedback signal that has a value that equals a previous output value of the slave latch when the previous output value of the slave latch equals the current output value of a master latch;
latching, by the master latch, an input signal received from the first circuit via the input of the master latch when the previous output value of the slave latch differs from the current output value of the master latch; wherein the input signal is synchronized with a first clock signal;
latching, by the master latch a feedback signal that has a value that equals the previous output value of the slave latch, when the previous output value of the slave latch equals the current output value of the master latch, the feedback signal provided via the output of the feedback circuit;
inverting, by the master inverter that is coupled between the master latch and the slave latch, a signal latched by the master latch to provide a master inverter output signal;
latching, by the slave latch, the master inverter output signal;
inverting, by the slave inverter that is coupled between the slave latch and the second circuit, a master inverter output signal latched by the slave latch to provide an output signal of a definite level;
wherein the output signal is synchronized with a second clock signal; wherein the first and second clock signals are mutually asynchronous.

12. The method according to claim 11 comprising preventing the feedback circuit from affecting a state of the master latch when the previous output value of the slave latch differs from the current output value of the master latch.

13. The method according to claim 11 comprising: receiving an output signal by a feedback transfer gate; performing a XOR operation on a master inverter output signal and the output signal to provide a control signal; and opening the feedback transfer gate, in response to the control signal, to facilitate a writing of the output signal to the master latch.

14. The method according to claim 11 comprising: receiving an output signal by a feedback transfer gate; performing a XOR operation on a master latch output signal and a slave latch output signal to provide a control signal; and opening the feedback transfer gate, in response to the control signal, to facilitate a writing of the output signal to the master latch.

15. The method according to claim 11 comprising providing a master latch output signal to a master inverter that has a high to low switching point that is substantially higher than a low to high switching point of the master inverter.

16. The method according to claim 11 comprising providing a master latch output signal to a master inverter that has a high to low switching point and a low to high switching point; wherein the high to low switching point is higher than half a supply voltage level and the low to high switching point is lower then half of the supply voltage level.

17. The method according to claim 11 comprising providing the input signal to a first transfer gate that is controlled by the second clock signal and providing to a master transfer gate another clock signal that is delayed in relation to the second clock signal.

18. The method according to claim 11 comprising: providing the input signal to a first transfer gate that precedes two master inverters and is controlled by the second clock signal; and providing to a second transfer gate another clock signal that is delayed in relation to the second clock signal.

19. The method according to claim 11 wherein the writing comprises sending a short duration pulse to the master latch of the synchronizer.

20. The method according to claim 11 wherein the writing comprises sending a medium duration pulse to the master latch of the synchronizer.

* * * * *